(12) United States Patent
Yanagihara et al.

(10) Patent No.: US 7,513,194 B2
(45) Date of Patent: Apr. 7, 2009

(54) SCREEN MASK

(75) Inventors: Naoto Yanagihara, Miyazaki (JP);
Masayuki Seto, Miyazaki (JP); Mikio Nakashima, Kunitomi (JP); Nobuyuki Ushifusa, Yokohama (JP)

(73) Assignee: Fujitsu Hitachi Plasma Display Limited, Miyazaki-Ken (JP)

( * ) Notice: Subject to any disclaimer, the term of this patent is extended or adjusted under 35 U.S.C. 154(b) by 0 days.

(21) Appl. No.: 11/790,677

(22) Filed: Apr. 26, 2007

(65) Prior Publication Data

US 2008/0098911 A1    May 1, 2008

(30) Foreign Application Priority Data

Oct. 31, 2006   (JP)   ............... 2006-295041

(51) Int. Cl.
*B41N 1/24*    (2006.01)
(52) U.S. Cl. ................... 101/127.1; 101/128.1
(58) Field of Classification Search ........... 101/127, 101/127.1, 128.1
See application file for complete search history.

(56) References Cited

U.S. PATENT DOCUMENTS 5,699,732 A * 12/1997 Sano .................... 101/127

6,063,476 A * 5/2000 Kinoshita .................... 428/131

FOREIGN PATENT DOCUMENTS

| JP | 11-37 | 3/1999 |
|---|---|---|
| JP | 2000-177099 | 6/2000 |
| JP | 2003-291555 | 10/2003 |
| JP | 2005-254750 | 9/2005 |

OTHER PUBLICATIONS

Japanese Office Action issued on Nov. 11, 2008 in corresponding Japanese Patent Application No. 2003-291555.

* cited by examiner

*Primary Examiner*—Leslie J Evanisko
(74) *Attorney, Agent, or Firm*—Staas & Halsey LLP

(57) ABSTRACT

A screen mask includes a screen mesh with a tensioning force of 196 to 392 N/mm; a tension mesh with a tensioning force of 49 to 98 N/mm; a resin plate (fixing part) arranged so as to surround the outer periphery of the screen mesh for fixing a part of the tension mesh with a tensioning force of 392 to 980 N/mm; and a screen frame. A length Ls of the screen mesh in a first direction intersecting a direction in which a squeegee squeegees on the screen mesh when performing a screen printing is 0.6 to 0.9 times a length Lt of the tension mesh in the first direction, a length Lk of the resin plate, the length Ls, and the length Lt in the first direction satisfy a relationship $Lk=a(Lt+Ls)/2$, where "a" is a coefficient in a range of 0.5 to 1.2.

2 Claims, 4 Drawing Sheets

SCREEN MASK

CROSS-REFERENCE TO RELATED APPLICATION

The present application claims priority from Japanese Patent Application No. JP 2006-295041 filed on Oct. 31, 2006, the content of which is hereby incorporated by reference into this application.

TECHNICAL FIELD OF THE INVENTION

The present invention relates to a technique for screen printing, in particular, to a technique that is effective when applied to a pattern formation on a flat display panel.

BACKGROUND OF THE INVENTION

Japanese Patent Application Laid-Open Publication No. 2003-291555 (Patent Document 1) discloses a printing screen supported by a screen supporting frame with a screen mesh in a tensed state by way of a tension mesh, where a rim region having higher elastic modulus than a print effective region is provided around the print effective region of the screen mesh, and the screen mesh is fixed to the tension mesh at the outer periphery of the rim region of high elastic modulus.

SUMMARY OF THE INVENTION

Screen printing is one kind of stencil printing methods in which a printing agent such as ink is caused to permeate through a stencil silk screen by squeegeeing (extruding the printing agent by a squeegee) so as to transfer a desired pattern onto a printed object, and is utilized in various uses such as circuit wiring formation of IC substrates and pattern formation (electrode formation or fluorescent substance layer formation) of FPDs (Flat Panel Displays).

Particularly, among manufacturing processes of PDP (Plasma Display Panel), screen printing techniques are applied in pattern formation processes such as electrode formation processes and fluorescent substance layer formation processes, and techniques which can perform highly precise printing on a large panel substrate are required in order to increase the display screen size of recent displays or to increase resolution of display image.

The inventors of the present invention have studied a technique of performing highly precise printing with a screen mask, and have come to recognize the following problems.

FIG. 9 is a plan view showing a configuration of a conventional common screen mask, and FIG. 10 is a plan view showing a state in which a tension mesh of the screen mask shown in FIG. 9 is fixed by a resin plate.

As shown in FIG. 9, the screen mask used in screen printing comprises a screen mesh (also referred to as inner mesh) 2 that functions as a print effective region, a tension mesh (also referred to as outer mesh) 3 formed on the periphery of the screen mesh 2, and a screen frame 5 for holding the screen mesh 2 in a tensed state by way of the tension mesh 3 with the tensile force within a predetermined range.

The screen mesh 2 has a plurality of holes for permeating a printing agent in squeegeeing, and a printing mask having openings formed in a predetermined pattern is made on the screen mesh 2 in a plate-making process.

Accordingly, in order to perform highly precise printing with the screen mask, the initial plate-making precision (precision of plate-making of the printing mask with a desired pattern) in the plate-making process must be improved, and the transfer precision (positional precision in permeating the printing agent through the holes of the screen mask and applying the printing agent to the object to be printed) in performing squeegeeing must be improved.

The initial plate-making precision lowers as the position of the screen mesh 2 is misaligned when the position of the tension mesh 3 is misaligned in plate-making the printing mask.

To improve the plate-making precision, a method of suppressing the position misalignment of the screen mesh 2 while plate-making the printing mask by fixing the tension mesh 3 formed at the periphery of the screen mesh 2 by a resin plate 4 etc. as shown in FIG. 10, is effective.

However, the inventors of the present invention have studied and found that when screen printing is performed with the screen mask 300 in which the tension mesh 3 is fixed, the transfer precision is lowered compared to the case where screen printing is performed with the screen mask 200 in which the tension mesh 3 is not fixed, since the screen mesh 2 that functions as the print effective region easily deforms due to the movement of the squeegee.

Therefore, the initial plate-making precision can be improved but the transfer precision lowers if the tension mesh 3 formed at the periphery of the screen mesh 2 is simply fixed without taking into consideration the tensioning force of the tension mesh 3, and the relationship in length of the screen mesh 2, the tension mesh 3, and the resin plate 4 in the direction intersecting a squeegeeing direction, and in consequence, the precision of screen printing cannot be improved.

In particular, this problem in lowering of the transfer precision becomes large when performing printing using a large screen mask such as manufacturing of PDPs, since the misalignment of the screen mesh 3 in squeegeeing increases as the plane dimension of the screen mask becomes larger.

An object of the present invention is to provide a technique capable of improving the screen printing precision.

The above and other objects and novel characteristics of the present invention will be apparent from the description of this specification and the accompanying drawings.

The typical ones of the inventions disclosed in this application will be briefly described as follows.

More specifically, a configuration of a screen mask including: a screen mesh with a tensioning force applied in a plane direction in a range of 196 to 392 N/mm; a tension mesh with a tensioning force applied in a plane direction in a range of 49 to 98 N/mm; a fixing part arranged so as to surround the outer periphery of the screen mesh, and fixing a part of the tension mesh with a tensioning force applied in a plane direction in a range of 392 to 980 N/mm; and a screen frame, wherein: length Ls of the screen mesh in a first direction intersecting a direction a squeegee squeegees on the screen mesh when performing screen printing is 0.6 to 0.9 times the length Lt of the tension mesh in the first direction; length Lk of the fixing part in the first direction, length Ls of the screen mesh in the first direction, and length Lt of the tension mesh in the first direction satisfy the relationship Lk=a(Lt+Ls)/2, where "a" is a coefficient; and the coefficient a is in a range of 0.5 to 1.2.

The effects obtained by typical aspects of the present invention will be briefly described below.

More specifically, the printing precision of screen printing is improved according to the present invention.

BRIEF DESCRIPTIONS OF THE DRAWINGS

DESCRIPTIONS OF THE PREFERRED EMBODIMENTS

In the following embodiments, explanations will be given separately in a plurality of sections or embodiments when needed for the sake of convenience. However, unless otherwise stated, they are not irrelevant to each other, but are in the relation that one of them is a modification example, detail, supplemental explanation and so on of a part or the entirety of the other part.

Moreover, in the following embodiments, when the numbers of elements or the like (including numbers, numerical values, amounts, ranges, etc.) are mentioned, unless, for example, it is otherwise stated and it is obviously limited to particular numbers in principle, they are not limited to the particular numbers, but may be larger or smaller than the particular numbers.

Note that components having the same function are denoted by the same reference symbols throughout the drawings for describing the embodiment, and the repetitive description thereof will be omitted. Hereinafter, embodiments of the present invention will be described in detail with reference to the accompanying drawings.

First Embodiment

In a first embodiment, a process of forming a fluorescent layer on a PDP for applying a fluorescent paste in cells partitioned by dividing walls (dividing walls for partitioning a discharge space by cells) formed on a surface of a panel substrate of the PDP will be described by way of example regarding a screen printing technique according to the present invention.

Figure 1:
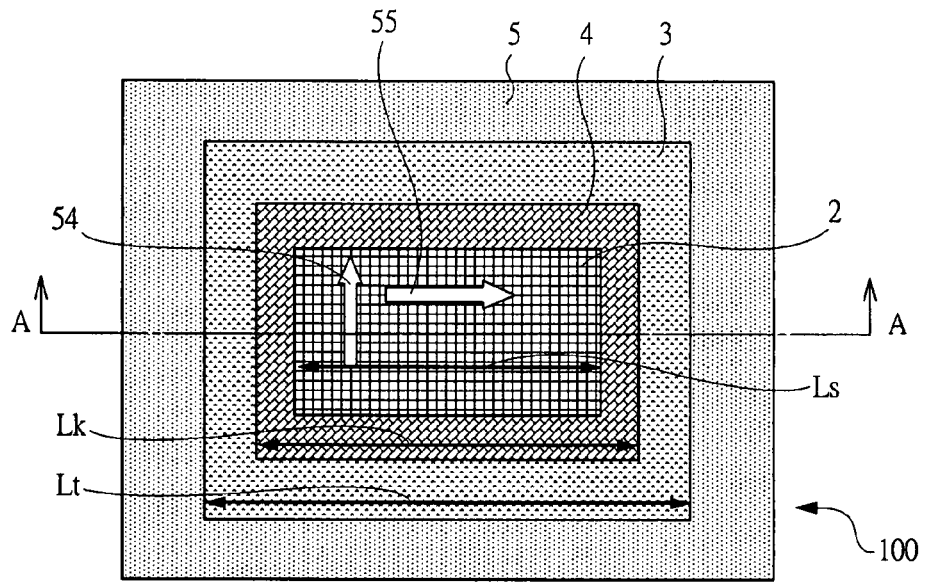
FIG. 1 is a plan view of a screen mask of a first embodiment of the present invention.
Figure 2:
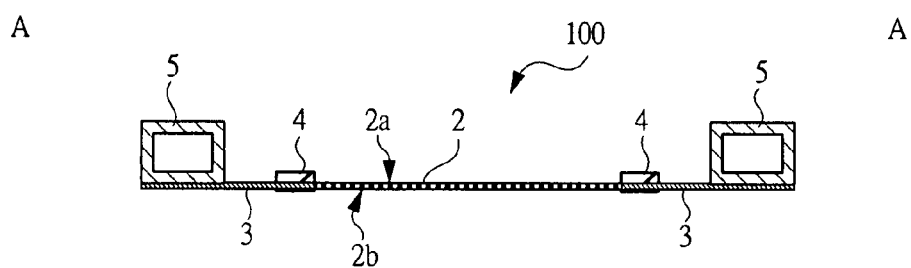
FIG. 2 is a cross sectional view showing the screen mask of FIG. 1 taken along the line A-A.
Figure 3:
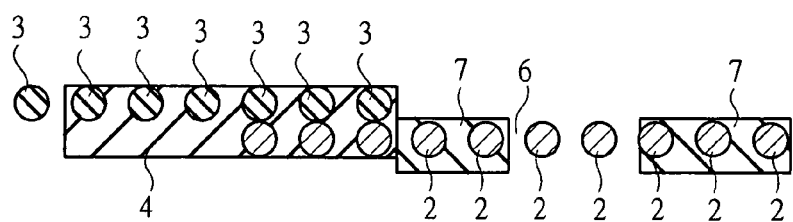
FIG. 3 is an enlarged cross sectional view showing, in an enlarged manner, the vicinity of a joining part of a screen mesh and a tension mesh of the screen mask shown in FIG. 2.

FIG. 1 is a plan view of a screen mask of the first embodiment, FIG. 2 is a cross sectional view of the screen mask of FIG. 1 taken along the line A-A, and FIG. 3 is an enlarged cross sectional view showing, in an enlarged manner, the vicinity of a joining part of a screen mesh and a tension mesh of the cross sectional view shown in FIG. 2.

In FIGS. 1 and 2, the screen mask 100 of the first embodiment includes a screen mesh 2 with a first surface 2a and a second surface 2b positioned on opposite sides to each other, and the screen mesh 2 has a plurality of holes through which a fluorescent paste serving as a printing agent permeates from the surface 2a towards the surface 2b.

The screen mesh 2 is obtained by forming metal such as aluminum in a mesh form, where the number of meshes (number of holes per one inch square) is about 230 to 260. In addition, the line diameter of the metal formed in the mesh form is about 16 to 25 μm.

The tensioning force applied in the plane direction (amount of force required to stretch by a unit distance in the plane direction) of the screen mesh 2 formed in the above manner is 196 to 392 N/mm (20 to 40 kgf/mm).

Further, the tension mesh 3 is arranged at the outer periphery of the screen mesh 2 so as to surround the periphery, and the tension mesh 3 is fixed by a resin plate (fixing part) 4. This resin plate 4 is arranged so as to surround the outer periphery of the screen mesh 2.

The tension mesh 3 is obtained by interweaving resin lines such as polyamide resin into a mesh form, and the tensioning force applied in the plane direction of the tension mesh 3 is 49 to 98 N/mm (5 to 10 kgf/mm), which is a value less than or equal to half the tensioning force applied to the screen mesh 2.

The resin plate 4 is a plate obtained by impregnating the tension mesh 3 with epoxy resin and the like and hardening, and the tensioning force applied in the plane direction of the region fixed by the resin plate 4 is 392 to 980 N/mm (40 to 100 kgf/mm), which is greater than the tensioning force applied to the screen mesh 2.

The screen frame 5 is arranged on the outer periphery of the tension mesh 3, and the outer peripheral edge of the tension mesh 3 is securely fixed to a lower surface of the screen frame 5. The screen frame 5 is obtained by forming a light weight metal such as aluminum into a square pipe shape and combining the same into a rectangle, as shown in FIG. 1.

A plate of a printing mask 7 formed with an opening 6 in a desired pattern is made on the screen mesh 2, as shown in FIG. 3. The plate of the printing mask 7 is made by applying a photoresist film on the screen mesh 2, and performing an exposure process and a developing process using the exposure mask of a desired pattern.

Plate-making with the desired pattern becomes difficult if the position of the screen mesh 2 is not fixed during performing the exposure process. That is, a problem of lowering the initial plate-making precision arises.

The position of the screen mesh 2 must be fixed during performing the exposure process in order to improve the initial plate-making precision. However, the tension mesh 3 contracts during performing the exposure process, so it is difficult to fix the position of the screen mesh 2, since the outer periphery of the screen mesh 2 is surrounded by the tension mesh 3 with the tensioning force applied in the plane direction, which is smaller than the screen mesh 2.

In the screen mask 100 of the first embodiment, the position of the screen mesh 2 can be fixed during performing the exposure process, since the resin plate 4 is arranged so as to surround the outer periphery of the screen mesh 2 and a part of the tension mesh 3 is fixed. Thus, the initial plate-making precision is improved compared to the screen mask in which the resin plate 4 is not arranged.

A relationship of a length Ls of the screen mesh 2, a length Lt of the tension mesh 3, and a length Lk of the resin plate 4 in a first direction 55 that intersects an arrow 54, which is a direction in which the squeegee squeegees on the screen mesh 2 in time of screen printing will be described with reference to FIG. 1.

The length Ls of the screen mesh 2 in the first direction 55 that intersects the arrow 54, which is the direction in which the squeegee squeegees on the screen mesh 2 in time of screen printing, is a value 0.6 to 0.9 times the length Lt of the tension mesh 3 in the first direction.

The length Lk of the fixed part in the first direction 55, the length Ls of the screen mesh 2 in the first direction 55, and the length Lt of the tension mesh 3 in the first direction 55 satisfy a relationship Lk=a(Lt+Ls)/2. The coefficient "a" is a proportionality coefficient to represent the relation of Ls, Lt, and Lk, and the value thereof is adjusted to a range of 0.5 to 1.2.

More particularly, the length Ls of the screen mesh 2, the length Lt of the tension mesh 3, and the length Lk of the resin plate 4 are set to be arranged in a range so as to improve the initial plate-making precision and suppress lowering in the transfer precision.

Figure 4:
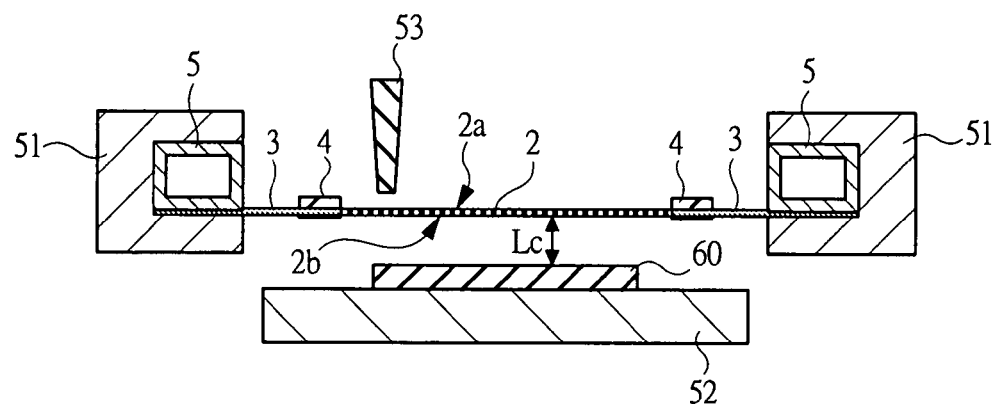
FIG. 4 is a cross sectional view showing a state before starting printing in a screen printing using the screen mask of the first embodiment of the present invention.
Figure 5:
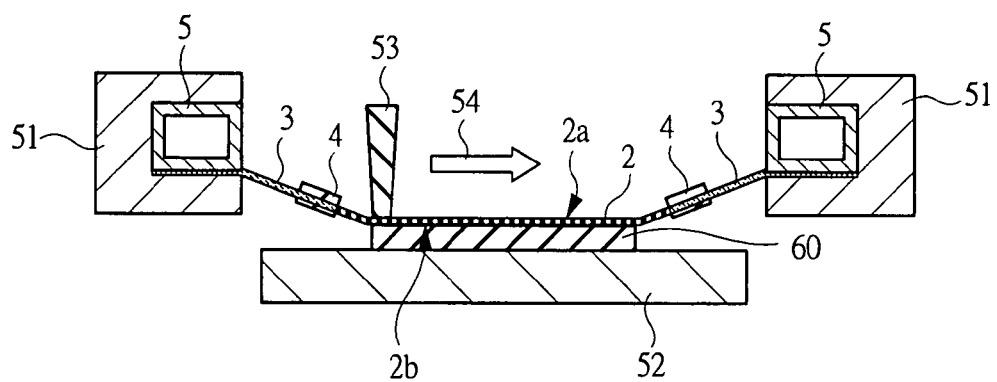
FIG. 5 is a cross sectional view showing a state in which a squeegee pushes the screen mesh toward an object to be printed in screen printing using the screen mask of the first embodiment of the present invention.

Next, a screen printing using the screen mask 100 will be described. FIG. 4 is a cross sectional view showing a state before starting screen printing, and FIG. 5 is a cross sectional view showing a state in which the squeegee pushes the screen mesh downward.

First, as shown in FIG. 4, the screen mask 100 of the first embodiment is arranged above a substrate 60 serving as an object to be printed and mounted on a printing stage 52, and the screen mask 100 is fixed to a screen frame holder 51 of a screen printing device.

Although not illustrated, a plurality of cells partitioned by dividing walls (dividing walls for partitioning the discharge space by cells) are formed on an upper surface of the substrate 60. In the screen printing described in the first embodiment, the fluorescent layer is formed by filling the fluorescent paste into the plurality of cells.

At the stage before starting the screen printing, the lower surface 2b of the screen mask 100 and the upper surface of the substrate 60 are not contacting each other, but are arranged to be facing each other with a predetermined clearance distance Lc.

A squeegee 53 as a spatula shaped member is arranged above the screen mesh 2 of the screen mask 100. The squeegee 53 is not contacting the screen mesh 2 at the stage before starting printing (transfer process).

The squeegee 53 then lowers, as shown in FIG. 5, and the transfer process starts. The squeegee 53 pushes the screen mesh 2 toward the upper end of the dividing walls formed on the upper surface of the substrate 60. That is, the lower surface 2b of the screen mesh 2 contacts the dividing walls formed on the upper surface of the substrate 60.

Next, the squeegee 53 squeegees in the direction (squeegeeing direction) shown by the arrow 54 with the screen mesh 2 pressed against the dividing walls formed on the upper surface of the substrate 60. The fluorescent paste is permeated through the holes and pushed out of the holes from the upper surface 2a towards the lower surface 2b of the screen mesh 2 by squeegeeing, and is filled into the plurality of cells formed on the substrate 60.

Since the screen mesh 2 is obtained by forming the metal material into a mesh form, the screen mesh 2 is stretched in the direction of the arrow 54 by the squeegee 53 when squeegeeing is performed, whereby the shape of the screen mesh 2 may be slightly deformed.

The tension mesh 3 is fixed at the periphery of the screen mesh 2 by the resin plate 4, and the tensioning force applied to the resin plate 4 is 392 to 980 N/mm (40 to 100 kgf/mm) which is greater than the tensioning force applied to the screen mesh 2. Thus, the tension mesh 3 is not fixed. For instance, the screen mesh 2 easily deforms in squeegeeing compared to a common screen mask such as screen mask 200 shown in FIG. 9.

Figure 10:
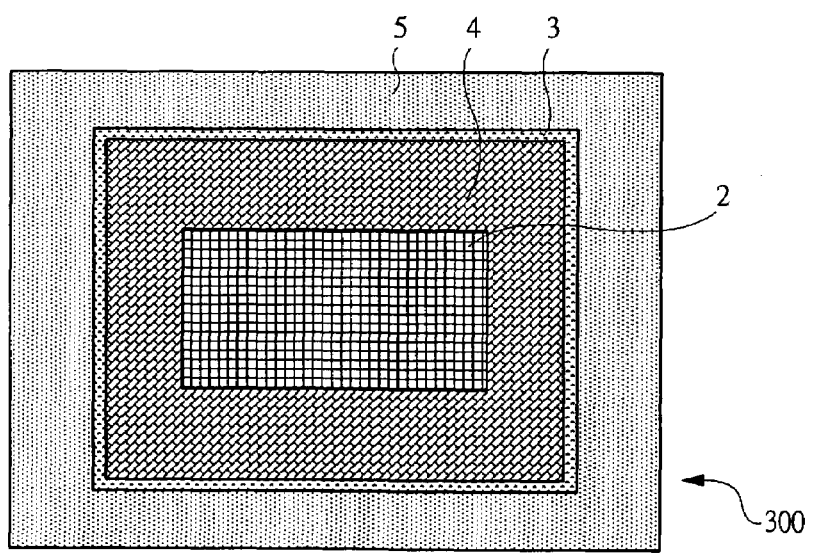
FIG. 10 is a plan view showing a screen mask in which the tension mesh of the screen mask shown in FIG. 9 is fixed by a resin plate.

If a screen printing is performed using the screen mask 300 shown in FIG. 10, which is a comparative example of the first embodiment, the screen mesh 2 easily deforms, and in consequence, the transfer precision is lowered.

According to studies made by the inventors of the present invention, it was found that the transfer precision is lowered particularly when the length of the resin plate 4 in the first direction 55 shown in FIG. 1 is too long and when the tensioning force applied to the tension mesh 3 is too large.

In the screen mask 100 of the first embodiment, the tensioning force applied to the tension mesh 3 is 49 to 98 N/mm (5 to 10 kgf/mm), which is smaller than the value of that in common screen masks.

Moreover, the relationship of Lk=a(Lt+Ls)/2 is satisfied when the proportionality coefficient a, which is the proportionality coefficient to represent the relationship of lengths Ls, Lt, and Lk in the first direction 55 shown in FIG. 1, is between 0.5 and 1.2.

Therefore, the force applied in the direction of the arrow 54 in which the squeegee 53 deforms the screen mesh 2 in time of squeegeeing is absorbed as the tension mesh 3 contracts, thereby suppressing deformation of the screen mesh 2.

When the deformation of the screen mesh 2 is suppressed, the positional relationship between the opening of the printing mask formed in the screen mesh 2 and the cells formed on the upper surface of the substrate 60 can be maintained at a predetermined state. The lowering in the transfer precision of screen printing is thereby suppressed.

Next, a printing precision of the screen printing will be described. Table 1 shows the differences in printing precision due to the difference between screen masks. As described above, two factors, the initial plate-making precision in platemaking the printing mask and the transfer precision in transferring the printing agent, determine the printing precision of screen printing.

TABLE 1

|  | Initial plate-making precision (μm) | Transfer precision (μm) | Printing precision (μm) |
|---|---|---|---|
| Screen mask 100 | ±20 | ±15 | ±25 |
| Screen mask 200 | ±40 | ±15 | ±43 |
| Screen mask 300 | ±20 | ±30 | ±36 |

Figure 9:
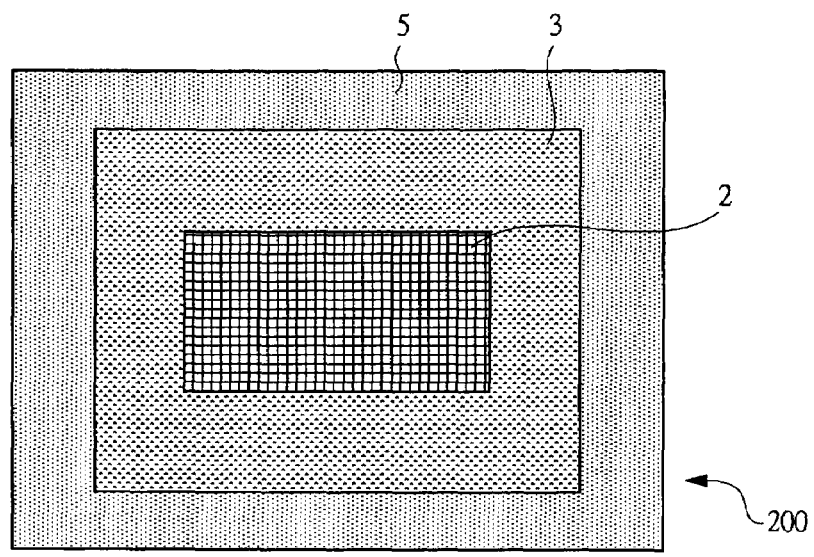
FIG. 9 is a plan view showing a screen mask in which a resin plate for fixing a tension mesh is not arranged, which serves as a comparative example of the present invention.

In Table 1, the screen mask 100 of the first embodiment is shown in the top row, the screen mask 200 shown in FIG. 9 in which the fixing part of tension mesh such as resin plate is not arranged, which serves as the comparative example of the first embodiment is shown in the middle row, and the screen mask 300 shown in FIG. 10 serving as the comparative example of the first embodiment is shown in the bottom row.

The left column in Table 1 shows the initial plate-making precision of each screen mask, the middle column shows the transfer precision of each screen mask, and the right column shows the printing precision, which is the comprehensive precision of the initial plate-making precision and the transfer precision. The measurement of each precision indicates, setting a predetermined position in advance, the value in the error distance from the actual plate-making position or the transfer position to the predetermined position as the precision.

As shown in Table 1, the screen mask 300 including the fixing part of tension mesh has significantly improved initial plate-making precision compared to the screen mask 200 that does not include the fixing part. However, the transfer precision is lower than the screen mask 200, and thus the comprehensive printing precision is just slightly improved.

The screen mask 100 of the first embodiment, on the other hand, significantly improved initial plate-making precision compared to the screen mask 200, and lowering in the transfer precision is suppressed, and thus the printing precision of screen printing can be greatly improved.

As a modification example of the first embodiment, a metal such as nickel may be plated in advance on the surface of the screen mesh 2 shown in FIGS. 1 and 2.

The printing agent such as fluorescent paste can easily permeate through the holes formed in the screen mesh 2 by plating a metal such as nickel on the surface of the screen mesh 2, compared to the case where plating is not performed.

When the printing agent easily permeates, the force of pushing the screen mesh 2 with the squeegee in time of squeegeeing can be reduced. Thus, the deformation of the screen mesh 2 involved in squeegeeing is further reduced, thereby improving the transfer precision.

Second Embodiment

The configuration for fixing the tension mesh by the resin plate has been described as a means for improving the initial plate-making precision of the screen mask in the first embodiment. In a second embodiment, a configuration for fixing the tension mesh through a method different from the first embodiment in time of initial plate-making will be described.

Figure 6:
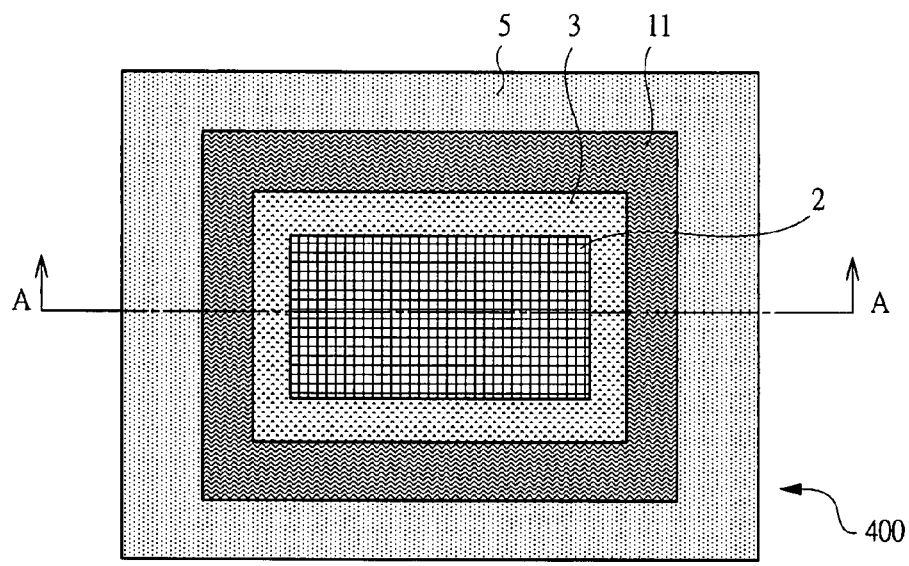
FIG. 6 is a plan view showing a screen mask of a second embodiment of the present invention.
Figure 7:
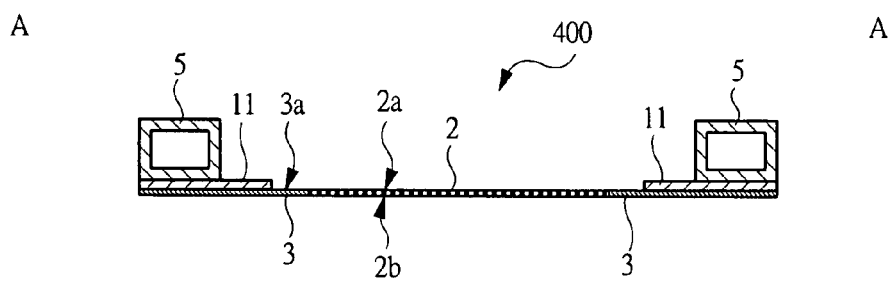
FIG. 7 is a cross sectional view of the screen mask of FIG. 6 taken along the line A-A.

FIG. 6 is a plan view of a screen mask of the second embodiment, and FIG. 7 is a cross sectional view of the screen mask shown in FIG. 6.

A first difference between a screen mask 400 of the second embodiment and the screen mask 100 of the first embodiment is that the resin plate 4 shown in FIG. 1 is not arranged in the screen mask 400. The screen mesh 2 and the tension mesh 3 of the screen mask 400 are adhered at the outer periphery of the screen mesh 2.

A second difference is that a frame of screen frame 11 extending from the screen frame 5 is arranged in the screen mask 400 to fix the tension mesh 3 as shown in FIG. 6.

As shown in FIGS. 6 and 7, the frame of screen frame 11 is formed from the lower surface of the screen frame 5 towards the screen mesh 2. The frame of screen frame 11 is formed so as to cover a part of an upper surface 3a (surface on a first surface side) of the tension mesh 3.

A region (second region) formed with the frame of screen frame 11 contacts the upper surface 3a of the tension mesh 3, but the frame of screen frame 11 and the tension mesh 3 are securely fixed by an adhesive and the like only at a region immediately under the screen frame 5, that is, a region (third region) sandwiched by the tension mesh 3 and the screen frame 5.

When forming the printing mask 7 as shown in FIG. 3 described in the first embodiment on the screen mask 400, the printing mask 7 may be formed from the upper surface 2a side of the screen mesh 2, or may be formed from the lower surface 2b side. When forming the printing mask 7 on the screen mask 400, the screen mask 400 shown in FIG. 7 is turned upside down, and the application of the photoresist film, the exposure process and the developing process are performed from the surface 2b side.

Therefore, the tension mesh 3 is supported by the frame of screen frame 11 when turning the screen mask 400 upside down and forming the printing mask 7 from the surface 2b side as described above. The position of the screen mesh 2 is thereby fixed when forming the printing mask 7.

In this case, the effect of fixing the position of the screen mesh 2 described above is obtained by supporting the tension mesh 3 by means of the frame of screen frame 11 during forming the printing mask, and thus the frame of screen frame 11 must cover a certain range or more of the upper surface 3a of the tension mesh 3 in order to obtain the predetermined effect.

According to study results of the inventors of the present invention, it was found that the position of the screen mesh 2 can be fixed during forming the printing mask if an area greater than or equal to at least half of the region (first region) in which the tension mesh 3 is formed is covered by the frame of screen frame 11.

Figure 8:
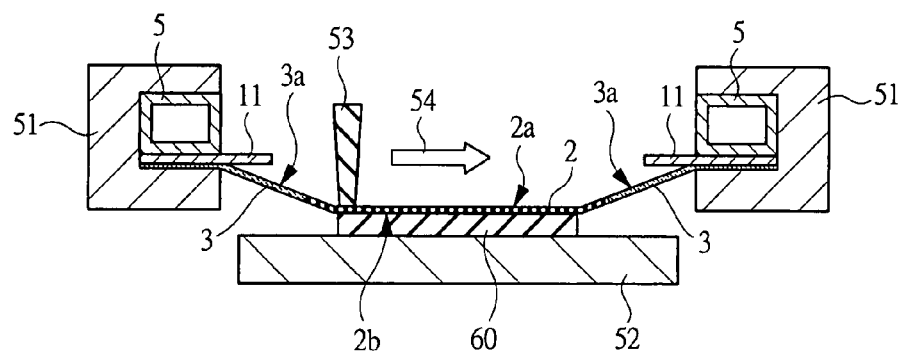
FIG. 8 is a cross sectional view showing a state in which the squeegee pushes the screen mesh toward the object to be printed in a screen printing using the screen mask of the second embodiment of the present invention.

Next, a screen printing using the screen mask 400 will be described. FIG. 8 is a cross sectional view showing a state in which the squeegee pushes the screen mesh toward the object to be printed in the screen printing using the screen mask 400. In FIG. 8, same reference characters denote components having the same function as in FIG. 5 described in the first embodiment, and thus the description thereof will be omitted.

When performing the screen printing using the screen mask 400 as shown in FIG. 8, the squeegee 53 squeegees in the direction (squeegeeing direction) shown by the arrow 54 with the screen mesh 2 pressed against the dividing walls formed on the upper surface of the substrate 60, similar to the transfer process described in the first embodiment. The fluorescent paste is permeated through the holes and pushed out of the holes from the upper surface 2a towards the lower surface 2b of the screen mesh 2 by squeegeeing, and is filled into the plurality of cells formed on the substrate 60.

Here, as previously described, the tension mesh 3 and the frame of screen frame 11 are securely fixed only at the third region where the frame of screen frame 11 is sandwiched between the tension mesh 3 and the screen frame 5. Thus, when the squeegee 53 pushes the screen mesh 2 downward, the tension mesh 3 is separated from the frame of screen frame 11 and extends downward as shown in FIG. 8.

Thus, the tension mesh 3 contracts without being subjected to the fixing force by the frame of screen frame 11 during the transfer process, thereby preventing lowering in the transfer precision as described in the first embodiment.

In other words, the screen mask 400 of the second embodiment improves the initial plate-making precision by arranging the frame of screen frame 11 therein, and prevents lowering in the transfer precision by limiting the region of securely fixing the frame of screen frame 11 and the tension mesh 3 to the third region, thereby consequently improving the printing precision of screen printing.

As a modification example of the second embodiment, a metal such as nickel may be plated in advance on the surface of the screen mesh 2 shown in FIGS. 6 and 7.

In this case, the printing agent can easily permeate through the screen mesh 2 as described in the first embodiment, and thus the force to push the screen mesh 2 with the squeegee in time of squeegeeing is reduced. Thus, the deformation of the screen mesh 2 involved in squeegeeing can be further reduced, thereby improving the transfer precision.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is applicable to screen printings, in particular, to a screen printing where high printing precision is required.

What is claimed is:

1. A screen mask comprising:
   a screen mesh having a first surface and a second surface positioned on opposite sides to each other and including a plurality of holes through which a printing agent permeates from the first surface towards the second surface, with a tensioning force in a plane direction in a range of 196 to 392 N/mm applied thereto;
   a tension mesh arranged so as to surround the outer periphery of the screen mesh, with a tensioning force in a plane direction in a range of 49 to 98 N/mm applied thereto;
   a fixing part arranged so as to surround the outer periphery of the screen mesh for fixing a part of the tension mesh, with a tensioning force in a plane direction in a range of 392 to 980 N/mm applied thereto; and
   a screen frame arranged so as to surround the outer periphery of the tension mesh for securely fixing and holding the outer periphery of the tension mesh,
   wherein: a length Ls of the screen mesh in a first direction intersecting a direction in which a squeegee squeegees on the screen mesh when performing a screen printing is 0.6 to 0.9 times a length Lt of the tension mesh in the first direction;
   a length Lk of the fixing part in the first direction, length Ls of the screen mesh in the first direction, and length Lt of the tension mesh in the first direction satisfy a relationship $Lk = a(Lt+Ls)/2$, where "a" is a coefficient; and
   the coefficient "a" is in a range of 0.5 to 1.2.

2. The screen mask according to claim 1, wherein a surface of the screen mesh is metal-plated.

* * * * *